(12) United States Patent
Choi

(10) Patent No.: US 12,231,144 B2
(45) Date of Patent: *Feb. 18, 2025

(54) ANALOG-TO-DIGITAL CONVERTER AND OPERATION METHOD THEREOF

(71) Applicant: SK keyfoundry Inc., Cheongju-si (KR)

(72) Inventor: Hun-Bae Choi, Seoul (KR)

(73) Assignee: SK keyfoundry Inc., Cheongju-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/236,648

(22) Filed: Aug. 22, 2023

(65) Prior Publication Data

US 2023/0396267 A1 Dec. 7, 2023

Related U.S. Application Data

(63) Continuation of application No. 17/546,144, filed on Dec. 9, 2021, now Pat. No. 11,799,493.

(30) Foreign Application Priority Data

Jul. 9, 2021 (KR) .......................... 10-2021-0090217

(51) Int. Cl.
*H03M 1/34* (2006.01)
*H03M 1/46* (2006.01)
*H03M 1/78* (2006.01)

(52) U.S. Cl.
CPC ............ *H03M 1/785* (2013.01); *H03M 1/462* (2013.01)

(58) Field of Classification Search
CPC ...... H03M 1/468; H03M 1/462; H03M 1/466; H03M 1/46; H03M 1/804; H03M 1/0641;

(Continued)

(56) References Cited

U.S. PATENT DOCUMENTS 5,570,091 A 10/1996 Noro et al.
6,850,181 B1 * 2/2005 Tsinker ............... H03M 1/0845
341/163

(Continued)

FOREIGN PATENT DOCUMENTS

KR 10-2000-0015455 A 3/2000
KR 10-2037610 B1 10/2019

OTHER PUBLICATIONS

Korean Office Action Issued on Jun. 6, 2022, in Counterpart Korean Patent Application No. 10-2021-0090217 (4 Pages in Korean).

(Continued)

*Primary Examiner* — Linh V Nguyen
(74) *Attorney, Agent, or Firm* — NSIP Law

(57) ABSTRACT

An analog-to-digital converter (ADC) and an operation method thereof are provided. The ADC includes: a comparator which compares a signal input through a first input terminal and a signal input through a second input terminal, and outputs an output value according to the comparison result. A successive approximation register receives the output value of the comparator, sets digital signal values from a most significant bit to a least significant bit, and outputs the digital signal values. A digital-to-analog converter receives the digital signal values, and converts it into an analog signal based on a reference voltage Vref, and outputs it to the second input terminal. A noise component is added to the input signal and to the analog signal Vdac'.

14 Claims, 6 Drawing Sheets

(58) Field of Classification Search
CPC .......... H03M 1/08; H03M 3/426; H03M 1/68; H03M 1/0612; H03M 1/0656; H03M 1/0678; H03M 1/0845; H03M 1/0854; H03M 1/0863; H03M 1/1009; H03M 1/1033; H03M 1/1057; H03M 3/458; H03M 3/464
USPC .................. 341/118–121, 150, 154, 155, 172
See application file for complete search history.

(56) References Cited

U.S. PATENT DOCUMENTS

| | | | |
|---|---|---|---|
| 7,015,853 B1 * | 3/2006 | Wolff | H03M 1/0641 341/161 |
| 7,880,650 B2 | 2/2011 | Feddeler et al. | |
| 9,197,240 B1 * | 11/2015 | Kinyua | H03M 1/0626 |
| 9,425,818 B1 | 8/2016 | Rajaee et al. | |
| 10,491,233 B1 * | 11/2019 | Emira | H03M 1/466 |
| 10,574,254 B2 * | 2/2020 | Lee | H03M 1/462 |
| 11,424,754 B1 | 8/2022 | Berens | |
| 11,799,493 B2 * | 10/2023 | Choi | H03M 1/462 |
| 2013/0082852 A1 * | 4/2013 | Coban | H03M 1/462 341/110 |
| 2017/0317683 A1 | 11/2017 | Bandyopadhyay et al. | |
| 2018/0083647 A1 * | 3/2018 | Yoshioka | H03M 1/466 |
| 2018/0183457 A1 * | 6/2018 | Lee | H03M 1/442 |
| 2019/0131988 A1 | 5/2019 | Li | |
| 2019/0166325 A1 * | 5/2019 | Kim | H04N 25/772 |
| 2019/0173479 A1 * | 6/2019 | Dyachenko | H03M 1/0641 |
| 2019/0173497 A1 | 6/2019 | El-Khamy et al. | |
| 2019/0181880 A1 * | 6/2019 | Huang | H03M 3/428 |
| 2019/0229747 A1 * | 7/2019 | Linkewitsch | H03M 1/462 |
| 2021/0306587 A1 * | 9/2021 | Tomita | H04N 25/677 |

OTHER PUBLICATIONS

Korean Office Action issued on Dec. 13, 2022, in counterpart Korean Patent Application No. 10-2021-0090217 (6 pages in English, 6 pages in Korean).

* cited by examiner

ANALOG-TO-DIGITAL CONVERTER AND OPERATION METHOD THEREOF

CROSS-REFERENCE TO RELATED APPLICATIONS

This application is a continuation of U.S. patent application Ser. No. 17/546,144 filed on Dec. 9, 2021, which claims the benefit under 35 USC 119(a) of Korean Patent Application No. 10-2021-0090217, filed on Jul. 9, 2021, in the Korean Intellectual Property Office, the entire disclosures of which are incorporated herein by reference for all purposes.

BACKGROUND

1. Field

The following description relates to an analog-to-digital converter and an operation method thereof.

2. Description of Related Art

An analog-to-digital converter (hereinafter, referred to as ADC) converts an analog signal to a digital signal, and may be implemented in various fields such as, but not limited to, mobile devices, home appliances, automotive industry, etc. There are various types of ADC. Recently, a successive approximation register (hereinafter, referred to as SAR) type ADC has been widely implemented.

The SAR-type ADC may perform quantization through binary search. The SAR-type ADC may continuously determine and output digital signal values from the most significant bit to the least significant bit, by using a digital-to-analog converter (hereinafter, referred to as DAC) and a comparator.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an analog-to-digital converter (ADC) includes a comparator, comprising a first input terminal, a second input terminal, and an output terminal, and configured to compare a signal input through the first input terminal and a signal input through the second input terminal, and output an output value Vout of 0 or 1 to the output terminal based on a result of the comparing; a successive approximation register (SAR), configured to receive the output value Vout of the comparator, set digital signal values from a most significant bit to a least significant bit, and output the digital signal values; and a digital-to-analog converter (DAC), configured to receive the digital signal values, and convert the received digital signal values into an analog signal Vdac' based on a reference voltage Vref, and output the analog signal Vdac' into the second input terminal, wherein the DAC is further configured to: add a noise component $\Delta$Vnoise to an analog input signal Vin to generate a first combined signal, and provide the first combined signal to the first input terminal, and add the noise component $\Delta$Vnoise to the analog signal Vdac', to generate a second combined signal, and provide the second combined signal to the second input terminal.

The DAC may further include a first reference voltage ladder, configured to provide the second combined signal to the second input terminal; a second reference voltage ladder, configured to provide the noise component $\Delta$Vnoise to the first input terminal; and a capacitor, configured to connect the first reference voltage ladder and the second reference voltage ladder.

The second reference voltage ladder may be configured to receive the noise component $\Delta$Vnoise through the capacitor, and provide the received noise component $\Delta$Vnoise to the first input terminal.

The second reference voltage ladder may include a virtual ground corresponding to the reference voltage.

The first reference voltage ladder and the second reference voltage ladder may be configured to have a same structure with a same passive element, and the passive element may include at least one of a resistor and the capacitor.

A first end of the first reference voltage ladder may be connected to a ground, and a first end of the second reference voltage ladder may be in a floating state.

The first reference voltage ladder may include a first portion, which comprises a plurality of resistors, and is configured to convert digital signal values of a portion of bits of the successive approximation register into analog signals; and a second portion, which comprises a plurality of capacitors, and is configured to convert digital signal values of remaining bits of the successive approximation register into analog signals, and wherein the second reference voltage ladder may be configured to have a same structure as a structure of the first reference voltage ladder.

In a general aspect, an analog-to-digital converter (ADC) operation method includes presetting, by a successive approximation register (SAR), a value of one bit from a most significant bit to a least significant bit; outputting, by the SAR, a digital signal value; converting, by a digital-to-analog converter (DAC), the digital signal value into an analog signal Vdac' based on a reference voltage Vref; outputting, by the DAC, a noise component $\Delta$Vnoise added to the analog signal Vdac' when the digital signal value is converted into the analog signal Vdac'; outputting, by the DAC, the analog signal Vdac'; receiving and comparing, by a comparator, the analog signal Vdac' and a signal in which the noise component $\Delta$Vnoise is added to an analog input signal Vin; and outputting, by the comparator, an output value Vout of 0 or 1 based on a result of the comparing.

The method may include setting, by the SAR, a value of any one bit from the most significant bit to the least significant bit based on the output value Vout, wherein the operations from the presetting to the outputting the output value Vout may be repeatedly performed, to set at least one remaining lower-order bit other than the set bit.

The converting the digital signal value into the analog signal Vdac' by the digital-to-analog converter (DAC) may include providing, by a first reference voltage ladder, the analog signal Vdac' comprising the noise component $\Delta$Vnoise to a second input terminal of the comparator; and providing, by a second reference voltage ladder, the noise component $\Delta$Vnoise to a first input terminal of the comparator, wherein the second reference voltage ladder is connected to the first reference voltage ladder through a capacitor.

The providing, by the second reference voltage ladder, the noise component $\Delta$Vnoise to the first input terminal of the comparator may include receiving, by the second reference voltage ladder, the noise component $\Delta$Vnoise from the first reference voltage ladder through the capacitor; and providing the received noise component ΔVnoise to the first input terminal of the comparator.

The providing, by the second reference voltage ladder, the noise component ΔVnoise to the first input terminal of the comparator may include outputting, by the second reference voltage ladder, a virtual ground value between the second reference voltage ladder and the capacitor.

The first reference voltage ladder and the second reference voltage ladder may have a same structure with a same passive element, and wherein the passive element may include at least one of a resistor and the capacitor.

A first end of the first reference voltage ladder may be connected to a ground, and a first end of the second reference voltage ladder is in a floating state.

The first reference voltage ladder may include a first portion which comprises a plurality of resistors and converts digital signal values of a portion of bits of the SAR into analog signals; and a second portion which comprises a plurality of capacitors and converts digital signal values of remaining bits of the SAR into analog signals, and wherein the second reference voltage ladder may have a same structure as a structure of the first reference voltage ladder.

In a general aspect, an analog-to-digital converter (ADC) includes a digital-to-analog converter, configured to generate an analog noise signal, and further configured to receive digital signal values, and convert the received digital signal values into an analog signal Vdac'; a comparator, configured to compare a first combined signal including an analog input signal and the analog noise signal, and a second combined signal including the analog signal Vdac' and the analog noise signal, and generate an output value based on a result of the comparing, and a successive approximation register (SAR), configured to receive the output value of the comparator, and set the digital signal values.

The DAC may further include a first reference voltage ladder comprising one of a first plurality of resistors and a second plurality of capacitors, and a second reference voltage ladder comprising one of a second plurality of resistors and a second plurality of capacitors.

The noise signal may be transmitted from the first reference voltage ladder to the second reference voltage ladder through a capacitor.

Other features and aspects will be apparent from the following detailed description, the drawings, and the claims.

Figure 1:
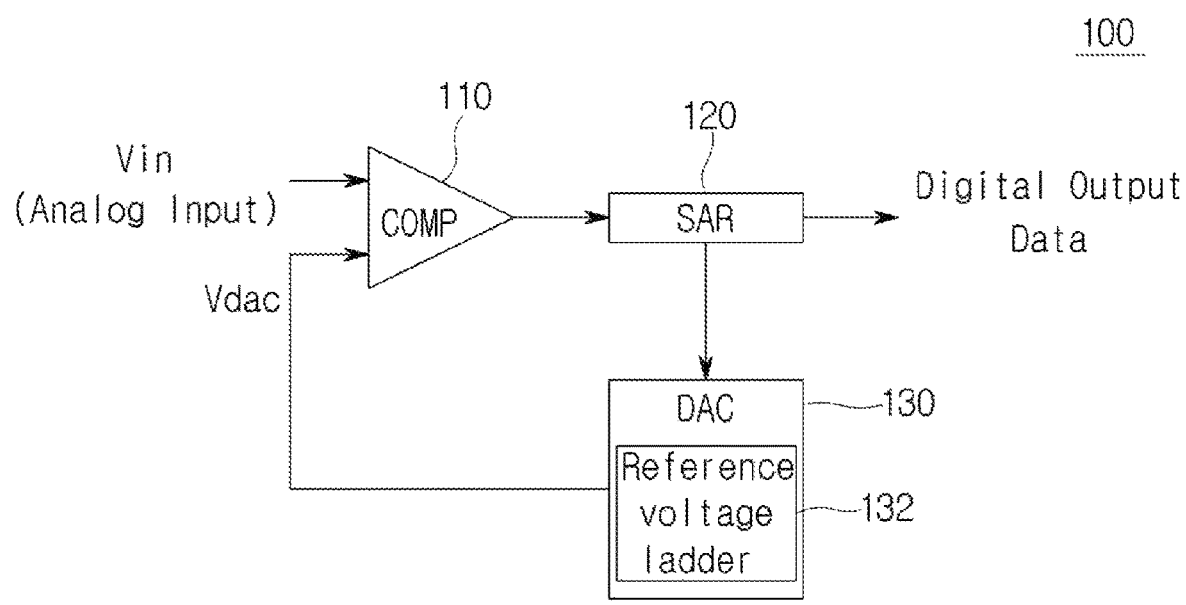
FIG. 1 illustrates an example structure of a typical SAR-type ADC, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Unless otherwise defined, all terms used herein including technical or scientific terms have the same meaning as commonly understood by one of ordinary skill in the art to which examples belong. Terms, such as those defined in commonly used dictionaries, are to be interpreted as having a meaning that is consistent with their meaning in the context of the relevant art, and are not to be interpreted in an idealized or overly formal sense unless expressly so defined herein.

Hereinafter, example embodiments will be described in detail with reference to the accompanying drawings. When describing the example embodiments with reference to the accompanying drawings, like reference numerals refer to like elements and a repeated description related thereto will be omitted.

In order to improve the accuracy of the SAR-type ADC, it is important that the output value of the DAC included in the SAR-type ADC is not affected by external influences such as noise, etc. However, in practical applications, the output value of the DAC may be affected by various noise components (e.g., power noise, ground noise, and noise caused by other external influences).

Accordingly, the examples present an analog-to-digital converter having high performance even in the presence of noise, and an operation method thereof.

In the successive approximation register (SAR) type analog-to-digital converter (ADC) according to various examples, by applying noise components applied to the output value of an internal digital-to-analog converter to the analog signal input terminal of the comparator, the same performance may be obtained as that of a noise-free environment even in the presence of various noise.

FIG. 1 illustrates a structure of a typical SAR-type ADC 100.

Referring to FIG. 1, the typical SAR-type ADC 100 may include a comparator 110, a successive approximation register (SAR) 120, and a digital-to-analog converter (DAC) 130.

The comparator 110 may compare an analog input signal (or analog input voltage) Vin input through a first input terminal of the comparator 110, and a signal Vdac input through a second input terminal of the comparator 110, and may output a high or low digital signal Vout according to a result of the comparison. The signal Vdac input through the second input terminal of the comparator 110 may be an analog signal (or analog voltage) output from the DAC 130. In an example, the comparator 110 may output a high signal when the analog input signal Vin is greater than the output signal Vdac of the DAC 130, and the comparator 110 may output a low signal when the analog input signal Vin is less than the output signal Vdac of the DAC 130.

The SAR 120 may continuously store digital signal values from the most significant bit (MSB) to the least significant bit (LSB) based on the digital signal output from the comparator 110, and may output the stored value as a digital signal data (digital output data).

The DAC 130 may convert the digital signal value stored in the SAR 120 into an analog signal in accordance with a reference voltage Vref, and output the converted digital signal.

In an example, the DAC 130 may output an analog signal corresponding to the digital signal value based on a reference voltage ladder 132. The analog signal output from the DAC 130 may be provided to the second input terminal of the comparator 110.

As described above, the typical SAR-type ADC 100 may convert an analog signal into a digital signal based on the DAC 130 and the comparator 110. However, various noise components exist in an actual environment, and the various noise components may affect the output signal of the DAC 130. The noise components may degrade the performance of the SAR-type ADC 100. In an example, the analog signal output from the reference voltage ladder of the DAC 130 may be a signal in which various noise components such as power noise, ground noise, or noise caused by external influences, are reflected. The typical SAR-type ADC 100 may output incorrect digital signal data based on the output signal of the DAC 130 in which the noise component is reflected.

In an example, in an ideal situation without noise, if an analog input signal is "4.5 mV" and a digital signal value stored in the three-bit SAR 120 is "101", the DAC 130 may output an analog signal of "5 mV" corresponding to the digital signal value "101" based on the reference voltage ladder. In this instance, the comparator 110 may output a low signal because the analog input signal of "4.5 mV" input through the first input terminal is smaller than the output signal of the "5 mV" of the DAC 130 input through the second input terminal.

However, in the presence of noise, if an analog input signal is "4.5 mV" and a digital signal value stored in the three-bit SAR 120 is "101", the DAC 130 may output an analog signal of "4 mV" in which a noise component ($\Delta V_{noise}=-1$ mV) is reflected, instead of an analog signal of "5 mV" corresponding to the digital signal value "100", based on the reference voltage ladder. In this instance, the comparator 110 may output a high signal because the analog input signal of "4.5 mV" input through the first input terminal is greater than the output signal of the "4 mV" of the DAC 130 input through the second input terminal. That is, as the DAC outputs the analog signal in which the noise component is reflected, the comparator outputs the opposite result to the ideal situation without noise, which leads to degradation of the performance of the SAR-type ADC.

Accordingly, in one or more examples of the present disclosure, an analog-to-digital converter having high performance even in the presence of noise and an operation method thereof will be described.

Figure 2:
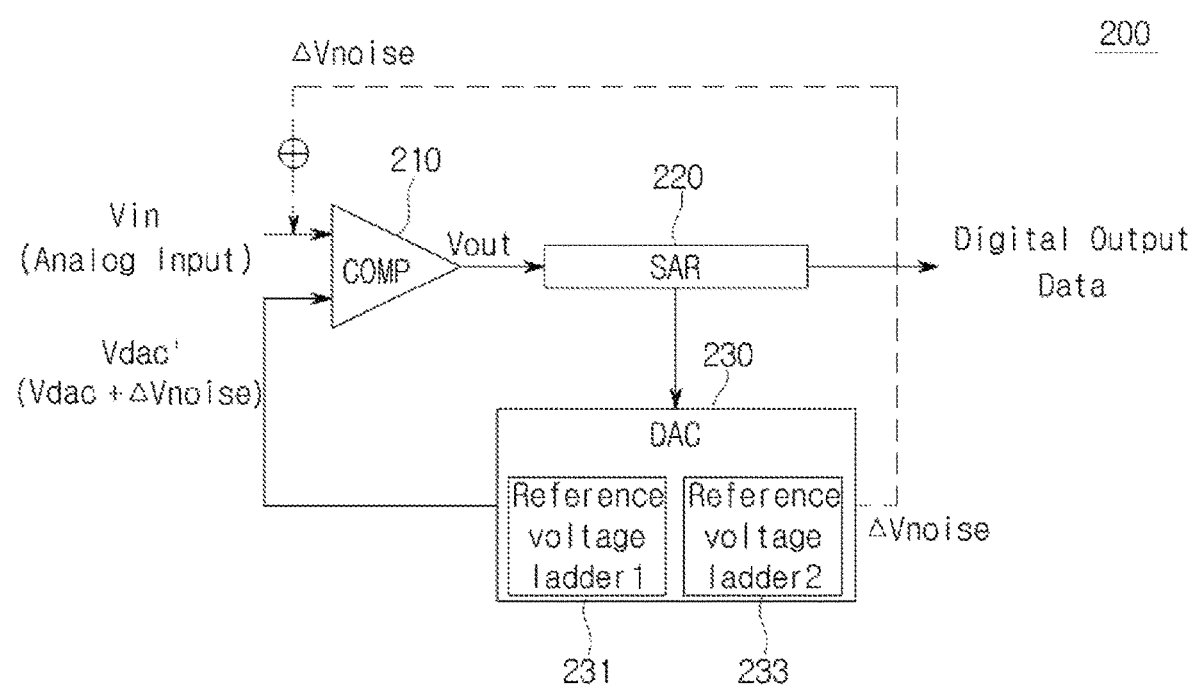
FIG. 2 illustrates an example structure of a SAR-type ADC, in accordance with one or more embodiments.

FIG. 2 illustrates an example structure of a SAR-type ADC 200, in accordance with one or more embodiments. Hereinafter, some components of the SAR-type ADC 200 will be described with reference to FIGS. 3A and 3B.

Figure 3A:
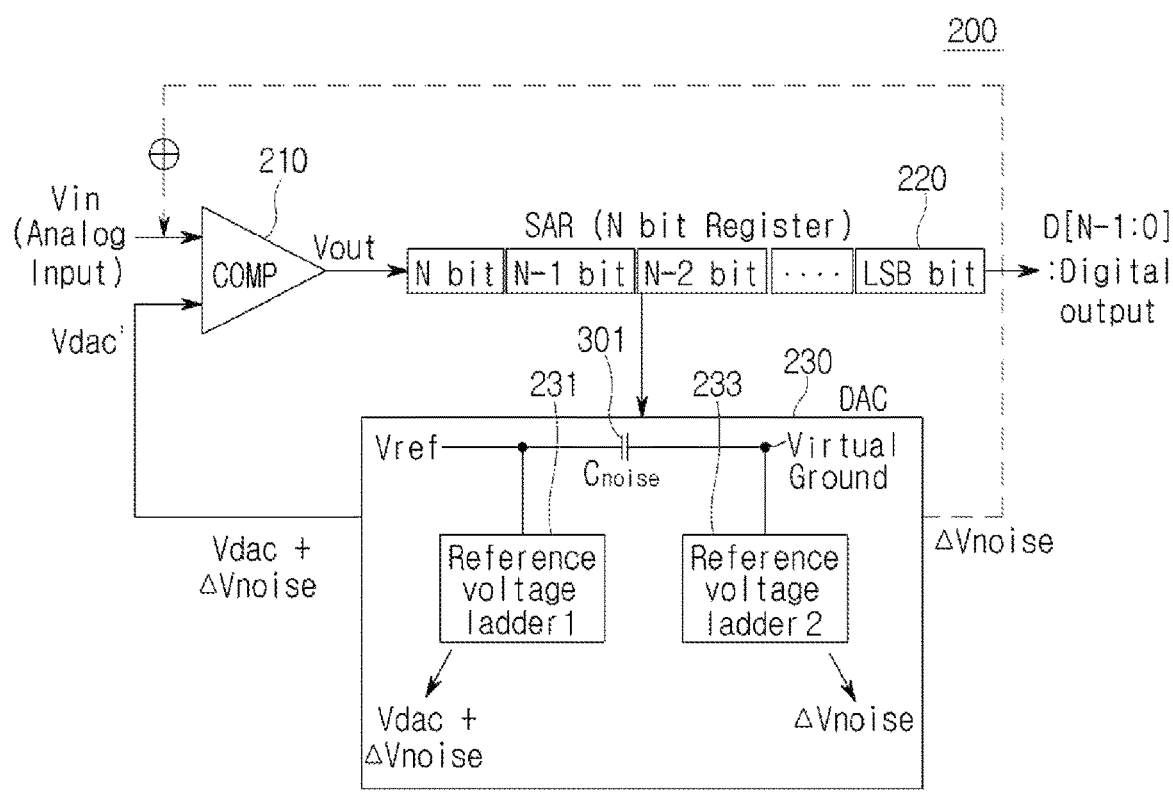
FIG. 3A illustrates an example structure of an N-bit SAR-type ADC, in accordance with one or more embodiments.
Figure 3B:
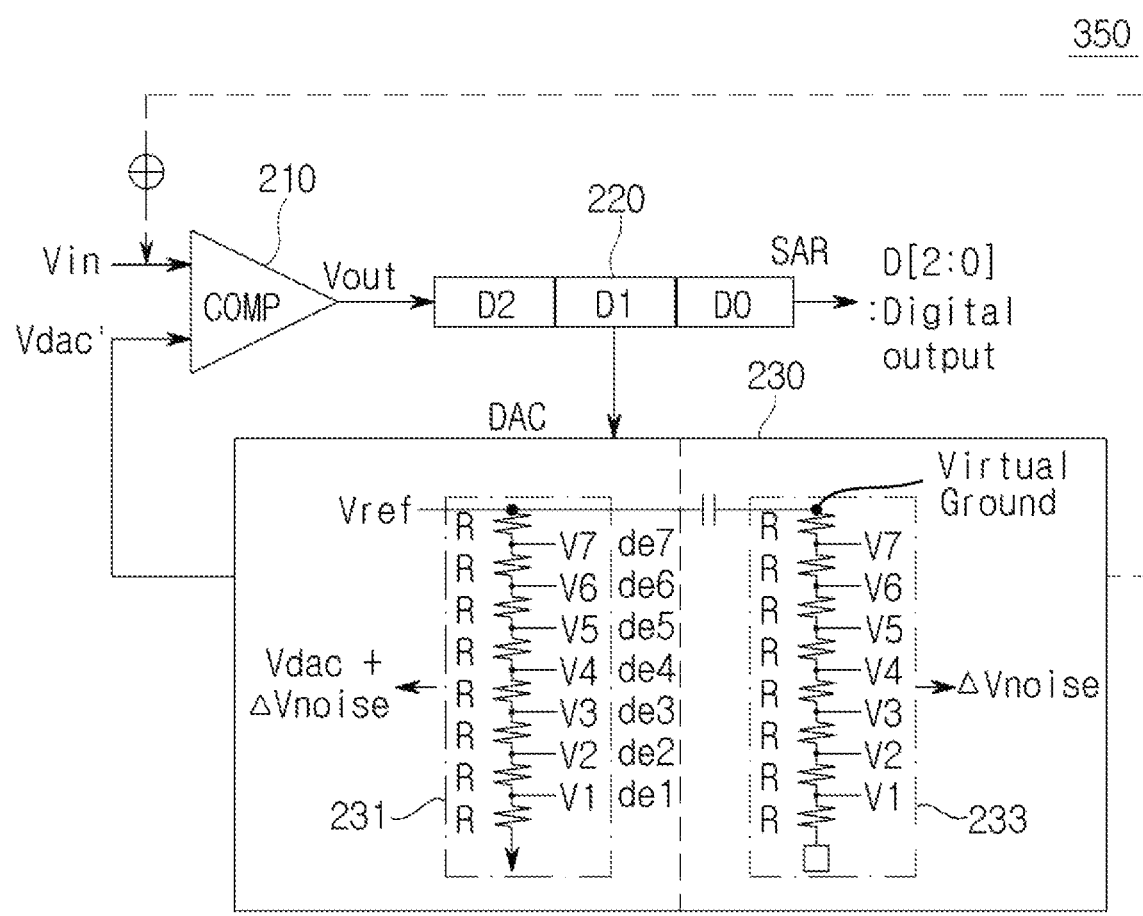
FIG. 3B illustrates an example structure of a three-bit SAR-type ADC, in accordance with one or more embodiments.

FIG. 3A illustrates an example structure of an N-bit SAR-type ADC, in accordance with one or more embodiments. FIG. 3B illustrates an example structure of a three-bit SAR-type ADC 350, in accordance with one or more embodiments.

Referring to FIG. 2, the SAR-type ADC 200, according to one or more embodiments, may include a comparator 210, a successive approximation register (SAR) 220, and a digital-to-analog converter (DAC) 230.

In one or more examples, the comparator 210 may compare an analog signal (or voltage) input through a first input terminal of the comparator 210 with an analog signal input through a second input terminal of the comparator 210, and may output a high digital signal or a low digital signal Vout according to a result of the comparison.

In an example, the analog signal input through the first input terminal of the comparator 210 may be a signal Vin+ΔVnoise obtained by adding an analog signal ΔVnoise having a noise component output from the DAC 230 to an analog input signal Vin. The analog input signal Vin may refer to an analog signal input through an input terminal of the SAR-type ADC 200. In an example, a signal Vdac' input through the second input terminal of the comparator 210 is a signal output from the DAC 230, and may be an analog signal Vdac+ΔVnoise in which a noise component is reflected. The comparator 210 may output a high signal when the analog signal Vin+ΔVnoise input through the first input terminal is greater than the analog signal Vdac+ΔVnoise input through the second input terminal (that is, Vin+ΔVnoise>Vdac+ΔVnoise). The comparator 210 may output a low signal when the analog signal Vin+ΔVnoise input through the first input terminal is less than the analog signal Vdac+ΔVnoise input through the second input terminal (that is, Vin+ΔVnoise<Vdac+ΔVnoise).

In one or more examples, the SAR 220 may include an N-bit register, and thus, may continuously store digital signal values from the most significant bit (MSB) to the least significant bit (LSB) based on the digital signal output from the comparator 210, and may output the stored value as a digital signal data (digital output data).

In one or more examples, the DAC 230 may convert the digital signal value stored in the SAR 220 into an analog signal in accordance with a reference voltage, and may output the analog signal. In one or more examples, the DAC 230 may output an analog signal corresponding to the digital signal value in accordance with the reference voltage based on a reference voltage ladder1 231. In an example, the output analog signal Vdac' may be a signal Vdac+ΔVnoise to which a noise component applied to the reference voltage ladder1 is applied. In an example, Vdac means an analog signal that the DAC 230 outputs for a corresponding first digital signal value by using the reference voltage ladder1, in an ideal situation in which no noise component is applied to the reference voltage ladder1.

ΔVnoise may be an analog signal corresponding to the noise component applied to the reference voltage ladder1 in an actual situation in which noise components exist. In an example, the reference voltage ladder1 231 may be implemented in the form of a resistance type including a plurality of resistance elements, of a capacitor type including a plurality of capacitors, or a combination thereof.

In one or more examples, the DAC 230 may output the analog signal ΔVnoise corresponding to the noise component applied to the reference voltage ladder1 based on a reference voltage ladder2 233. The analog signal ΔVnoise which has the noise component, and is output based on the reference voltage ladder2 233, may be provided to the first input terminal of the comparator 210, and may be added to the analog input signal Vin. In one or more examples, the analog signal ΔVnoise, which has the noise component, may be added to the analog input signal Vin input to the SAR-type DAC 200 through an adder. In one or more examples, the reference voltage ladder2 233 may be formed in the same structure as that of the reference voltage ladder1 231 in order to have the same resistance value as a resistance value of the reference voltage ladder1 231.

In an example, when the reference voltage ladder1 231 is composed of a plurality of resistance elements or resistors, the reference voltage ladder2 233 may be composed of a plurality of resistance elements or resistors in the same manner as the reference voltage ladder1 231. In another example, when the reference voltage ladder1 231 is composed of a plurality of capacitors, the reference voltage ladder2 233 may be composed of a plurality of capacitors in the same manner as the reference voltage ladder1 231.

In another example, when the reference voltage ladder1 231 is implemented in the form of a combination of a plurality of resistance elements and a plurality of capacitors, the reference voltage ladder2 233 may be implemented in the form of a combination of a plurality of resistance elements and a plurality of capacitors in the same manner as the reference voltage ladder1 231.

Referring to FIG. 3A, in an example, the reference voltage ladder1 231 and the reference voltage ladder2 233 may be connected through a capacitor 301. The reference voltage ladder2 233 may be connected with the reference voltage ladder1 231 through the capacitor 301, so that the reference voltage ladder2 233 may receive, through the capacitor 301, the noise component applied to the reference voltage ladder1 231. In an example, a node between the reference voltage ladder2 233 and the capacitor 301 may be virtually grounded.

In an example, the reference voltage ladder1 231 and the reference voltage ladder2 233 may be configured to have the same structure with the same elements. However, in an example, one end of the reference voltage ladder1 231 may be connected to the ground, and one end of the reference voltage ladder2 233 may be open. In an example, the opening of the reference voltage ladder2 means a floating state. In an example, as illustrated in FIG. 3B, while the reference voltage ladder1 231 and the reference voltage ladder2 233 have the same structure including a plurality of resistance elements, one end of the reference voltage ladder1 231 may be connected to the ground, and one end of the reference voltage ladder2 233 may be open. In an example, the opening of the reference voltage ladder2 233 means a floating state.

In an example, the reference voltage ladder2 233 may output an analog signal corresponding to a virtual ground value in a state in which the noise component is not applied to the reference voltage ladder1 231. According to the example, when the noise component is applied to the reference voltage ladder1 231, the reference voltage ladder2 233 receives, through the capacitor 301, the noise component applied to the reference voltage ladder1 231, thereby outputting the analog signal ΔVnoise corresponding to the noise component.

Hereinafter, examples of operations of the SAR-type ADC proposed in the one or more examples will be described with reference to FIG. 3B as follows. In an example, for convenience of description, it is assumed that the SAR includes a three-bit register. Additionally, for convenience of description, it is assumed that noise is applied in an operation of determining the value of the least significant bit among operations of determining the values from the most significant bit to the least significant bit of the three-bit SAR. However, one or more examples may be applied in the same manner even when noise is applied in all of the operations of determining the values of the most significant bit to the least significant bit.

First, in an example, an analog input signal Vin of 4.5 mV may be input to the SAR-type ADCs 200 and 350. In an example, the SAR 220 may perform a preset operation to set the value of the most significant bit D2 to "high", and preset operations to set the values of the remaining lower-order bits D1 and D0 to "low". Depending on the preset operation, the digital signal value stored in the SAR 200 may be "100".

The DAC 230 may designate a value de4 corresponding to the digital signal value "100" stored in the SAR 220 by using an internal decoder, thereby outputting an analog signal corresponding to "100" through the reference voltage ladder1 231. Since a noise component is not applied to the reference voltage ladder1 231, the DAC 230 may output an analog signal of 4 mV (Vdac=4 mV) corresponding to "100" through the reference voltage ladder1 231. In an example, the reference voltage ladder2 233 of the DAC 230 may output an analog signal corresponding to the virtual ground value. Since a noise component is not applied to the reference voltage ladder1 231, the reference voltage ladder2 233 may output an analog signal of 0 mV.

The comparator 210 may compare the analog signal of 4.5 mV input through the first input terminal and the analog signal of 4 mV output from the DAC 230, that is, the output signal of the DAC 230, input through the second input terminal. Since the value (4.5 mV) of the analog signal input through the first input terminal is greater, the comparator 210 may output "high".

The SAR 220 may set the value of the most significant bit D2 to "high" since the output of the comparator 210 is "high".

Next, the SAR 220 may preset values of the remaining bits other than the set most significant bit. In order to determine the value of the second most significant bit D1, the SAR 200 may preset the value of the second most significant bit D1 to "high" and the value of the least significant bit D0 to "low".

Depending on the setting of the most significant bit and the preset operation to set other bits (D1 and D0) other than the most significant bit (D1), the digital signal value stored in the SAR 200 may be "110".

The DAC 230 may designate a value de6 corresponding to the digital signal value "110" stored in the SAR 220 by using an internal decoder, thereby outputting an analog signal corresponding to "110" through the reference voltage ladder1 231. Since a noise component is not applied to the reference voltage ladder1 231, the DAC 230 may output an analog signal of 6 mV (Vdac=6 mV) corresponding to "110" through the reference voltage ladder1 231. In an example, the reference voltage ladder2 233 of the DAC 230 may output an analog signal corresponding to the virtual ground value. Since a noise component is not applied to the reference voltage ladder1 231, the reference voltage ladder2 233 may output an analog signal of 0 mV.

The comparator 210 may compare the analog signal of 4.5 mV input through the first input terminal and the analog signal of 6 mV, that is, the output signal of the DAC 230, input through the second input terminal. Since the value of the analog signal input through the first input terminal may be smaller than the value of the signal input through the second input terminal, the comparator 210 may output "low".

The SAR 220 may set the value of the second most significant bit D1 to "low" since the output of the comparator 210 is "low".

Next, the SAR 220 may preset the value of the least significant bit D0, that is the remaining bit other than the set most significant bit D2 and the second most significant bit D1. In order to determine the value of the least significant bit D0, the SAR 200 may preset the value of the least significant bit D0 to "high".

Based on the setting of the most significant bit (D2) and the second most significant bit (D1) and the preset operation to set the least significant bit (D0), the digital signal value stored in the SAR 200 may be "101".

The DAC 230 designates a value de5 corresponding to the digital signal value "101" stored in the SAR 220 by using an internal decoder, thereby outputting an analog signal corresponding to "101" through the reference voltage ladder1 231. In an example, since the noise component is applied to the reference voltage ladder1 231, the DAC 230 may output the analog signal of 4 mV (5 mV(Vdac)+(−1 mV(ΔVnoise))) which has been changed by the influence of the noise component instead of an analog signal of 5 mV corresponding to "101" through the reference voltage ladder1 231. In an example, the reference voltage ladder2 233 of the DAC 230 may receive the noise component applied to the reference voltage ladder1 231 through the capacitor 301, and thus may output an analog signal of −1 mV corresponding to the noise component. The analog signal of −1 mV having the noise component output from the reference voltage ladder2 233 may be added to the analog input signal Vin and input to the first input terminal of the comparator 210.

In an example comparator 210 may receive, through the first input terminal, an analog signal of 3.5 mV (4.5 mV (Vin)+(−1 mV (ΔVnoise))) obtained by adding the analog input signal Vin of 4.5 mV and an analog signal of −1 mV having the noise component output from the DAC 230. The comparator 210 may compare the analog signal of 3.5 mV input through the second input terminal and the analog signal of 4 mV (5 mV (Vdac)+(−1 mV(ΔVnoise))), that is, the output signal of the DAC 230. Since the value of the analog signal input through the first input terminal may be smaller than the value of the analog signal input through the second input terminal (Vin+ΔVnoise<Vdac+ΔVnoise), the comparator 210 may output "low".

The SAR 220 may set the value of the least significant bit D0 to "low" since the output of the comparator 210 is "low".

Finally, the SAR 220 may output a final digital data of "100".

As described above, in the SAR-type ADC according to one or more embodiments, the same noise component may be applied to analog signals which are input to both terminals of the comparator 210, so that the influence by the noise component in the comparator 210 can be cancelled. That is, in the SAR-type ADC according to one or more examples, even if noise is generated in the DAC, the comparator 210 may be able to output a result signal based on the difference between the analog input signal (Vin) and the output signal (Vdac) of the internal DAC, without being affected by the noise.

In FIG. 3B described above, it is assumed that the DAC 230 is a resistor type DAC (RDAC), which includes the reference voltage ladders 231 and 233 composed of resistance elements. However, according to various embodiments, the reference voltage ladder1 231 and the reference voltage ladder2 233 of the DAC may be disposed to include both the capacitor and resistance elements.

In one or more examples, in an n-bit SAR-type ADC, the DAC may be composed of the resistor type DAC (RDAC) which is responsible for higher-order "a" bits and a capacitor type DAC (CDAC) which is responsible for lower-order "b" (n-a) bits. Conversely, in the n-bit SAR-type ADC, the DAC may be composed of the CDAC which is responsible for the higher-order "a" bits and the RDAC which is responsible for the lower-order "b" (n-a) bits.

Figure 4:
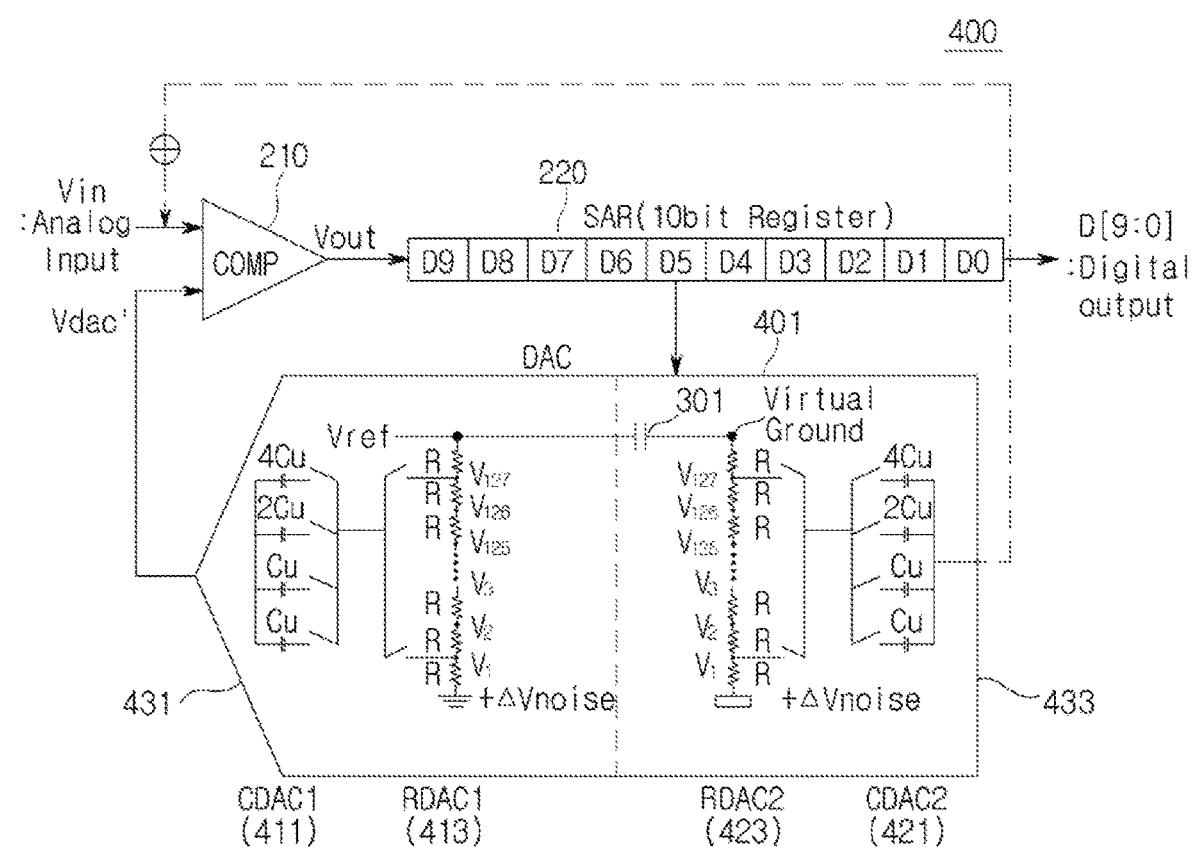
FIG. 4 shows an example structure of a ten-bit SAR-type ADC, in accordance with one or more embodiments.

FIG. 4 illustrates an example structure of a ten-bit SAR-type ADC, in accordance with one or more embodiments.

As illustrated in FIG. 4, a DAC 401 may include a reference voltage ladder1 431 composed of a RDAC1 413 which is responsible for higher-order seven bits, and a CDAC1 411 which is responsible for lower-order three bits, and a reference voltage ladder2 433 composed of a RDAC2 423 which is responsible for the higher-order seven bits, and a CDAC2 421 which is responsible for the lower-order three bits. The SAR-type ADC illustrated in FIG. 4 differs from the example of FIG. 3B only in that the reference voltage ladder1 and the reference voltage ladder2 are composed of resistance elements and capacitors, and other example structures and/or example operation methods may be the same as described with reference to FIG. 3B.

In an example, the reference voltage ladder1 431 and the reference voltage ladder2 433 may be, as described in FIGS. 2 to 3B, connected through the capacitor 301, and one end of the reference voltage ladder1 431 may be connected to the ground and one end of the reference voltage ladder2 433 may be opened. Additionally, the reference voltage ladder2 433 may receive a voltage component applied to the reference voltage ladder1 431 through the capacitor 301, thereby outputting an analog signal corresponding to the noise component.

Figure 5:
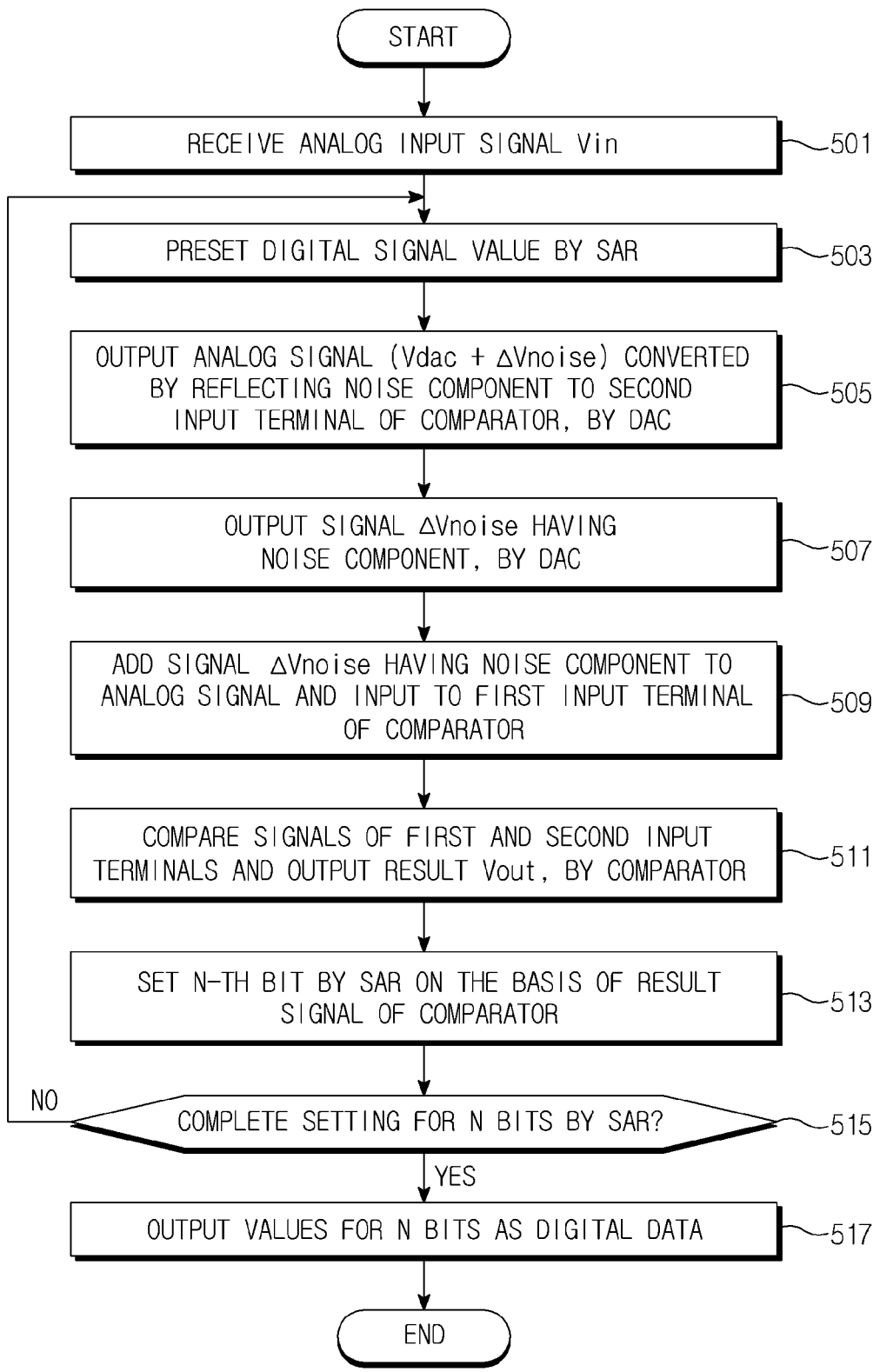
FIG. 5 illustrates a flowchart of converting an analog signal to a digital signal in an example SAR-type ADC, in accordance with one or more embodiments.

FIG. 5 is a flowchart illustrating an example of converting an analog signal to a digital signal in the SAR-type ADC, in accordance with one or more embodiments.

The operations in FIG. 5 may be performed in the sequence and manner as shown, although the order of some operations may be changed or some of the operations omitted without departing from the spirit and scope of the illustrative examples described. Many of the operations shown in FIG. 1 may be performed in parallel or concurrently.

In an example, the SAR-type ADC may be the SAR-type ADC described with reference to FIGS. 2, 3A, 3B, and/or 4.

Referring to FIG. 5, in operation 501, the SAR-type ADC may receive the analog input signal Vin. The analog input signal Vin may be provided to a first input terminal of the comparator 210.

In operation 503, the SAR 220 of the SAR-type ADC may perform a preset operation from the most significant bit to the least significant bit of the N-bit register. In an example, the SAR 220 may preset the value of the bit, which is to be set, to "high", and may then set the next lower-order bits to "low". In an example, in an operation of setting the most significant bit (MSB), the value of the most significant bit (MSB) may be preset to "high", and the other bits may be preset to "low". In another example, in an operation of setting the second most significant bit, the value of the second most significant bit may be preset to "high", and the next lower-order bits may be preset to "low".

In operation 505, the DACs 230 and 401 of the SAR-type ADC may output an analog signal (Vdac+ΔVnoise) in which the noise component is reflected to a second input terminal of the comparator. In an example, the DACs 230 and 401 may convert the digital signal value set in the SAR into an analog signal in accordance with a reference voltage by using the reference voltage ladders1 231 and 431. In an example, a noise component may be applied to the reference voltage ladders1 231 and 431, and the analog signal converted by reflecting the noise component may be output by the reference voltage ladders1 231 and 431.

In operation 507, the DACs 230 and 401 of the SAR-type ADC may output the signal ΔVnoise having a noise component. In an example, the DACs 230 and 401 may output an analog signal corresponding to the noise component by using the reference voltage ladders2 233 and 433 through the reference voltage ladders1 231 and 431 and the capacitor 301. For example, the reference voltage ladders2 233 and 433 receive, through the capacitor 301, the noise component applied to the reference voltage ladders1 231 and 431, thereby outputting the analog signal corresponding to the noise component. When a noise component is not applied to the reference voltage ladders1 231 and 431, the reference voltage ladders2 233 and 433 may output a virtual ground value.

In operation 509, the SAR-type ADC may add the signal ΔVnoise having the noise component output from the DACs 230 and 401 to the analog signal received in operation 501, and may input the signal to a first input terminal of the comparator 210.

In operation 511, the comparator 210 of the SAR-type ADC may compare the signals of the first input terminal and the second input terminal, and may output a result signal based on a result of the comparison to the SAR 220.

In operation 513, the SAR 220 of the SAR-type ADC may set (or fix) the value of the corresponding bit based on the output signal of the comparator 210.

In operation 515, the SAR 220 of the SAR-type ADC may determine whether the value setting for all N bits is completed. When the value setting for all N bits is not completed, the SAR 220 may return to operation 503 in order to set the value of the next lower-order bit. When the value setting for all N bits is completed, in an example, when values are set from the most significant bit to the least significant bit, the SAR 220 may output the values for the N bits as digital data in operation 517. In an example, the SAR 220 may output the values for the N bits as a digital signal for the analog signal received in operation 501.

Table 1 below shows the performance evaluation results of a typical SAR-type ADC and the SAR-type ADC proposed in the one or more examples.

In Table 1 below, the typical structure means a typically provided 10-bit SAR-type ADC shown in FIG. 1, and the proposed structure may mean a 10-bit SAR-type ADC proposed in the one or more examples illustrated in FIGS. 2 to 4.

TABLE 1

| Performance | SNR(dB) | SNDR(dB) | THD(-dB) | ENOB(bit) |
| --- | --- | --- | --- | --- |
| Typical structure | 54 | 49 | 51 | 7.98 |
| Example structure | 60 | 59 | 67 | 9.57 |

Referring to the performance evaluation results shown in Table 1, it may be seen that characteristics of the ADC having the proposed structure illustrated in the one or more examples with noise components removed, may be significantly better than characteristics of the ADC having the typical structure. In one or more examples, a signal-to-noise ratio (SNR) means an analog signal-to-noise ratio, and a signal-to-noise distortion ratio (SNDR) means an analog signal-to-noise and harmonic distortion ratio. Additionally, a total harmonic distortion (THD) means a total harmonic distortion ratio, and an effective number of bits (ENOB) means the effective number of bits excluding noise and harmonic distortion.

In an example, the SNR may be defined as follows in Equation 1 below.

$$SNR=10 \log(P_s/P_{noise})=20 \log(V_{signal}/V_{noise})[dB] \quad \text{Equation (1):}$$

In Equation 1, Ps may mean a desired signal power, and Pnoise may mean an undesired signal power, which may mean noise.

A high analog signal-to-noise ratio means that an applied analog signal can be converted into a more detailed digital signal. In an example, a nine-bit ADC can subdivide an analog signal into 512 (=$2^9$) codes, and a ten-bit ADC can subdivide an analog signal into 1024 (=$2^{10}$) codes. In terms of SNR characteristics, this can be noted as Equation 2 and Equation 3 below.

Equation 2 represents the SNR of the nine-bit ADC, and Equation 3 represents the SNR of the ten-bit ADC.

$$SNR=20 \log(V_{signal}/noise)=20 \log 2^9/1)=20 \log (512)=54 \text{ dB} \quad \text{Equation (2):}$$

$$SNR=20 \log(V_{signal}/V_{noise})=20 \log(2^{10}/1)=20 \log (1024)=60 \text{ dB} \quad \text{Equation (3):}$$

As shown in Equations 2 and 3, when the ADC proposed in the one or more examples is used instead of the typical structure, it can be seen that the characteristics of the ADC may be improved.

The comparator 110/210, SAR 120/220, DAC 130/230, and other apparatuses, units, modules, devices, and other components described herein and with respect to FIGS. 1-5, are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods that perform the operations described in this application and illustrated in FIGS. 1-5 are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller, e.g., as respective operations of processor implemented methods. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computers using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

A number of example embodiments have been described above. Nevertheless, it should be understood that various modifications may be made to these example embodiments. In an example, suitable results may be achieved if the described techniques are performed in a different order and/or if components in a described system, architecture, device, or circuit are combined in a different manner and/or replaced or supplemented by other components or their equivalents.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An analog-to-digital converter (ADC), comprising:
a comparator, comprising a first input terminal, a second input terminal, and an output terminal, and configured to compare a signal input through the first input terminal and a signal input through the second input terminal, and output an output value Vout of 0 or 1 to the output terminal based on a result of the comparing;
a successive approximation register (SAR), configured to receive the output value Vout of the comparator, set digital signal values from a most significant bit to a least significant bit, and output the digital signal values; and
a digital-to-analog converter (DAC), configured to receive the digital signal values, and convert the received digital signal values into an analog signal Vdac' based on a reference voltage Vref, and output the analog signal Vdac' into the second input terminal,
wherein the DAC is further configured to:
generate the analog signal Vdac' comprising a noise component ΔVnoise and provide the analog signal Vdac' to the second input terminal, and
provide the noise component ΔVnoise to the first input terminal, and
wherein the noise component ΔVnoise provided to the first input terminal is added to an analog input signal (Vin), which is to be converted to a digital signal value, and is input to the comparator through the first input terminal, and
wherein the DAC further comprises a first reference voltage ladder, configured to provide the analog signal Vdac' comprising the noise component ΔVnoise to the second input terminal and a second reference voltage ladder, configured to provide the noise component ΔVnoise to the first input terminal.

2. The ADC of claim 1,
wherein the DAC further comprises a capacitor, configured to connect the first reference voltage ladder and the second reference voltage ladder; and
wherein the second reference voltage ladder is configured to receive the noise component ΔVnoise through the capacitor, and provide the received noise component ΔVnoise to the first input terminal.

3. The ADC of claim 1,
wherein the second reference voltage ladder comprises a virtual ground corresponding to the reference voltage Vref.

4. The ADC of claim 1,
wherein the first reference voltage ladder and the second reference voltage ladder are configured to have a same structure with a same passive element, and
wherein the passive element comprises at least one of a resistor or the capacitor.

5. The ADC of claim 1,
wherein a first end of the first reference voltage ladder is connected to a ground, and
wherein a first end of the second reference voltage ladder is in a floating state.

6. The ADC of claim 1,
wherein the first reference voltage ladder comprises:
a first portion, which comprises a plurality of resistors, and is configured to convert digital signal values of a portion of bits of the SAR into analog signals; and
a second portion, which comprises a plurality of capacitors, and is configured to convert digital signal values of remaining bits of the SAR into analog signals, and
wherein the first reference voltage ladder and the second reference voltage ladder are configured to have a same structure.

7. An analog-to-digital converter (ADC) operation method, the operation method comprising:
presetting, by a successive approximation register (SAR), a value of one bit from a most significant bit to a least significant bit;
outputting, by the SAR, a digital signal value;
converting, by a digital-to-analog converter (DAC), the digital signal value into an analog signal Vdac' comprising a noise component ΔVnoise, based on a reference voltage Vref;
outputting, by the DAC, the noise component ΔVnoise and the analog signal Vdac' comprising the noise component ΔVnoise, respectively;

receiving and comparing, by a comparator comprising a first input terminal, a second input terminal, and an output terminal, a signal comprising an analog input signal Vin, which is to be converted to a digital signal value, to which the noise component ΔVnoise is added, and the analog signal Vdac'; and outputting, by the comparator, an output value Vout of 0 or 1 based on a result of the comparing, wherein the outputting the analog signal Vdac' comprising the noise component ΔVnoise comprises providing, by a first reference voltage ladder, the analog signal Vdac' comprising the noise component ΔVnoise to the second input terminal of the comparator and providing, by a second reference voltage ladder, the noise component ΔVnoise to the first input terminal of the comparator.

8. The method of claim 7, further comprising setting, by the SAR, a value of any one bit from the most significant bit to the least significant bit based on the output value Vout, wherein the operations from the presetting to the outputting the output value Vout are repeatedly performed, to set at least one remaining lower-order bit other than the set bit.

9. The method of claim 7, wherein the second reference voltage ladder is connected to the first reference voltage ladder through a capacitor.

10. The method of claim 7, wherein the providing, by the second reference voltage ladder, the noise component ΔVnoise to the first input terminal of the comparator comprises:

receiving, by the second reference voltage ladder, the noise component ΔVnoise from the first reference voltage ladder through the capacitor; and providing the received noise component ΔVnoise to the first input terminal of the comparator.

11. The method of claim 7, wherein the providing, by the second reference voltage ladder, the noise component ΔVnoise to the first input terminal of the comparator comprises outputting, by the second reference voltage ladder, a virtual ground value between the second reference voltage ladder and the capacitor.

12. The method of claim 7, wherein the first reference voltage ladder and the second reference voltage ladder have a same structure with a same passive element, and wherein the passive element comprises at least one of a resistor or the capacitor.

13. The method of claim 7, wherein a first end of the first reference voltage ladder is connected to a ground, and wherein a first end of the second reference voltage ladder is in a floating state.

14. The method of claim 7, wherein the first reference voltage ladder comprises:

a first portion which comprises a plurality of resistors and converts digital signal values of a portion of bits of the SAR into analog signals; and a second portion which comprises a plurality of capacitors and converts digital signal values of remaining bits of the SAR into analog signals, and wherein the first reference voltage ladder and the second reference voltage ladder are configured to have a same structure.

* * * * *